United States Patent
Uchibori (10) Patent No.: US 8,621,326 B2
(45) Date of Patent: Dec. 31, 2013

(54) ERROR CORRECTION CIRCUIT AND ERROR CORRECTION METHOD

(75) Inventor: Shusaku Uchibori, Yamanashi (JP)

(73) Assignee: NEC Corporation, Tokyo (JP)

( * ) Notice: Subject to any disclaimer, the term of this patent is extended or adjusted under 35 U.S.C. 154(b) by 448 days.

(21) Appl. No.: 12/825,636

(22) Filed: Jun. 29, 2010

(65) Prior Publication Data

US 2011/0022930 A1    Jan. 27, 2011

(30) Foreign Application Priority Data

Jul. 24, 2009  (JP) ................................. 2009-172856

(51) Int. Cl.
  *G11C 29/00*  (2006.01)
  *G06F 11/00*  (2006.01)

(52) U.S. Cl.
  USPC .............. 714/766; 714/48; 714/52; 714/54; 714/718; 714/719; 714/763; 714/768; 365/201; 365/49.1; 711/108

(58) Field of Classification Search
  USPC ............... 714/48, 52, 54, 718, 719, 763, 766, 714/768; 365/201, 49.1; 711/108
  See application file for complete search history.

(56) References Cited

U.S. PATENT DOCUMENTS

| | | | |
|---|---|---|---|
| 6,597,595 B1 * | 7/2003 | Ichiriu et al. ............... | 365/49.18 |
| 6,822,913 B2 * | 11/2004 | Pochmuller .................. | 365/201 |
| 6,956,577 B2 * | 10/2005 | Radke et al. ................. | 345/531 |
| 6,987,684 B1 * | 1/2006 | Branth et al. .............. | 365/49.17 |
| 7,328,377 B1 * | 2/2008 | Lewis et al. ..................... | 714/48 |
| 7,493,549 B2 * | 2/2009 | Nicolaidis ...................... | 714/763 |
| 8,112,678 B1 * | 2/2012 | Lewis et al. .................... | 714/48 |

FOREIGN PATENT DOCUMENTS

| | | |
|---|---|---|
| JP | 63-121947 A | 5/1988 |
| JP | 2-153457 A | 6/1990 |
| JP | 2-216563 A | 8/1990 |
| JP | 10-27481 A | 1/1998 |
| JP | 2002279785 A | 9/2002 |
| JP | 2004334980 A | 11/2004 |
| JP | 2004362315 A | 12/2004 |
| JP | 2005339745 A | 12/2005 |

OTHER PUBLICATIONS

Japanese Office Action for JP2009-172856 issue May 24, 2011.
J. Yamada, "Technical Report, Current State and Future Trend of Dedicated Memory" Monthly Semiconductor World, vol. 11, Section 7, May 20, 1992, pp. 54-57.

* cited by examiner

*Primary Examiner* — John J Tabone, Jr.

(57) ABSTRACT

An error correction circuit 1 in accordance with an aspect of the invention includes an associative memory 20, a logic circuit 10 disposed in parallel with the associative memory 20, and selection unit 30 that receives an output signal from the associative memory 20 and an output signal from the logic circuit 10 as an input. The associative memory 20 includes a table that handles an input signal as a word and holds an output signal related to the word and an error correction code used to correct the output signal as data. The associative memory 20 further includes error correction unit that outputs a signal in which an error was corrected based on data related to a word corresponding to an input signal. The selection unit 30 selects and outputs one of an output signal from the associative memory 20 and an output signal from the logic circuit 10.

7 Claims, 6 Drawing Sheets

-- PRIOR ART --

Fig. 7
-- PRIOR ART --

# ERROR CORRECTION CIRCUIT AND ERROR CORRECTION METHOD

INCORPORATION BY REFERENCE

This application is based upon and claims the benefit of priority from Japanese patent application No. 2009-172856, filed on Jul. 24, 2009, the disclosure of which is incorporated herein in its entirety by reference.

BACKGROUND OF THE INVENTION

1. Technical Field

The present invention relates to an error correction circuit and an error correction method, in particular an error correction circuit and an error correction method to correct an error that occurs when an input signal is input to a logic circuit.

2. Background Art

Conventionally, errors sometimes occur in data stored in internal RAMs (Random Access Memories) of LSI (Large Scale Integration) circuits and in data held in registers and the like due to causes such as soft errors. For such errors, it has been possible to perform error correction and error detection by adding an ECC (Error Correction Code), a parity, and/or the like to the relevant data. For example, a soft error may occur when a neutron(s) or the like causes an electrical charge in the medium of the material of an LSI chip.

Meanwhile, a typical logic circuit that performs internal control of an LSI device has a complicated configuration. Therefore, although it has been possible to perform error detection processing on a logic circuit, it has been very difficult to perform error correction processing on a logic circuit. Techniques relating to error detection processing for logic circuits are described hereinafter.

Figure 6:
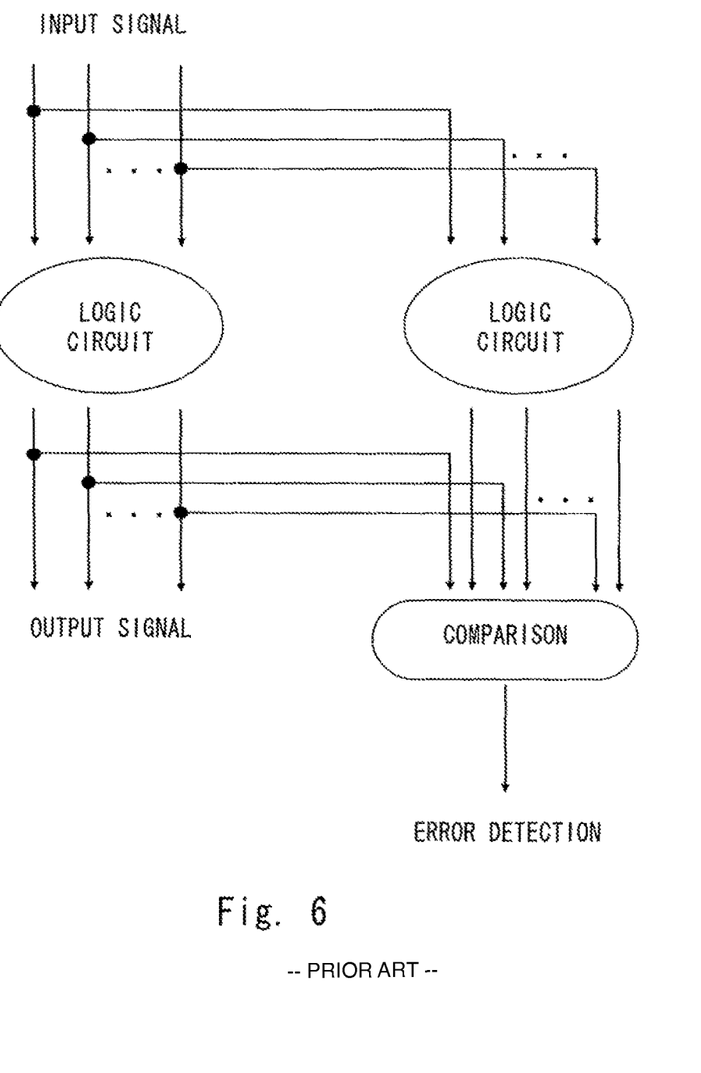
FIG. 6 is a conceptual diagram of error detection by redundancy of a conventional logic circuit.
Figure 7:
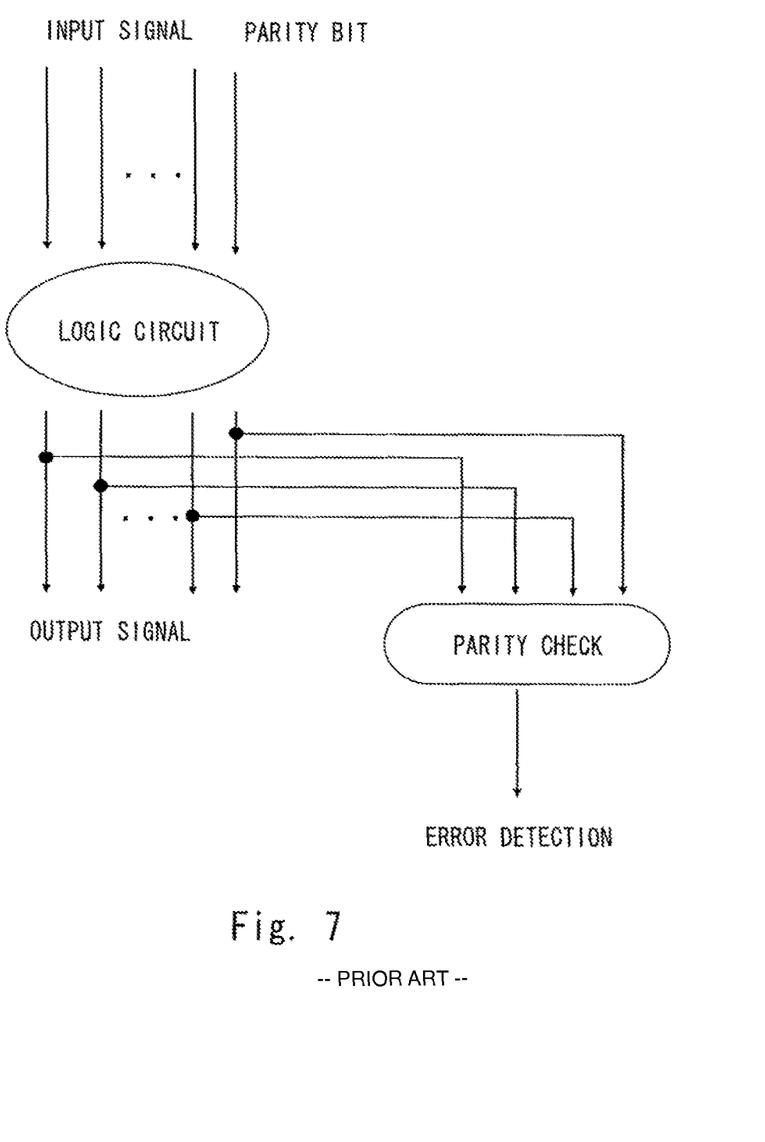
FIG. 7 is a conceptual diagram of parity prediction of a conventional logic circuit.

FIG. 6 shows a general idea for detecting an error(s) by redundancy of a logic circuit in an LSI device. An LSI device shown in FIG. 6 compares outputs of equivalent logic circuits arranged in parallel to determine whether or not there is an error(s) in the outputs from the logic circuits. FIG. 7 shows a general idea for detecting an error by using parity prediction. An LSI device shown in FIG. 7 supplies a parity bit(s) as well as an input signal(s) to a logic circuit. It compares an output signal output from the logic circuit with the parity bit, and thereby determines whether or not there is an error in the output from the logic circuit based on the parity.

However, both the redundancy of a logic circuit and the parity prediction are a technique for detecting an error as described above, and therefore they cannot perform error correction processing. In recent years, as the LSI manufacturing process has been miniaturized, it is conceivable that the number of cases where an error occurs even in the internal logic circuit of an LSI device could become larger. Therefore, techniques capable of not only detecting an error that has occurred in the internal logic circuit of an LSI device but also correcting the error are important.

Note that it is conceivable to realize a circuit that performs equivalent operations to those of a desired logic circuit and is equipped with an error correction function by a PLA (Programmable Logic Array), and substitute this PLA circuit for the logic circuit.

However, there is a problem in the above-mentioned configuration using a PLA that configuring the PLA is complicated. That is, to obtain the equivalent operations to those of the desired logic circuit, the user needs to configure the entire circuit configuration information including the error correction processing before or during circuit operations. Further, the user also needs to grasp the operations of the desired logic circuit. Therefore, there has been a problem that users have to go through a lot of trouble.

The present invention has been made to solve these problems, and an exemplary object thereof is to provide an error correction circuit capable of correcting an error with a simple configuration.

SUMMARY

In a first exemplary aspect of the invention, an error correction circuit includes: an associative memory to which an input signal is input; a logic circuit to which the input signal is input, the logic circuit being disposed in parallel with the associative memory; and selection unit that selects and outputs one of an output signal from the associative memory and an output signal from the logic circuit, wherein the associative memory includes: a table that holds an output signal that is supposed to be obtained when an input signal is input to the logic circuit, and an error correction code used to correct an error of the output signal; and error correction unit that corrects an output signal corresponding to an input signal by using the error correction code and outputs a signal in which an error was corrected, and when there are an output signal and an error correction code corresponding to the input signal in the associative memory, the selection unit selects and outputs an output signal from the associative memory.

The above and other objects, features and advantages of the present invention will become more fully understood from the detailed description given hereinbelow and the accompanying drawings which are given by way of illustration only, and thus are not to be considered as limiting the present invention.

EXEMPLARY EMBODIMENT

[First Exemplary Embodiment]

Exemplary embodiments in accordance with the present invention are explained hereinafter with reference to the drawings. Firstly, a fundamental configuration of an error correction circuit in accordance with a first exemplary embodiment of the present invention is explained with reference to FIG. 1. An error correction circuit 1 includes a logic circuit 10, an associative memory 20 (Content Addressable Memory: hereinafter, may also be referred to as "CAM 20"), and selection unit 30.

Figure 1:
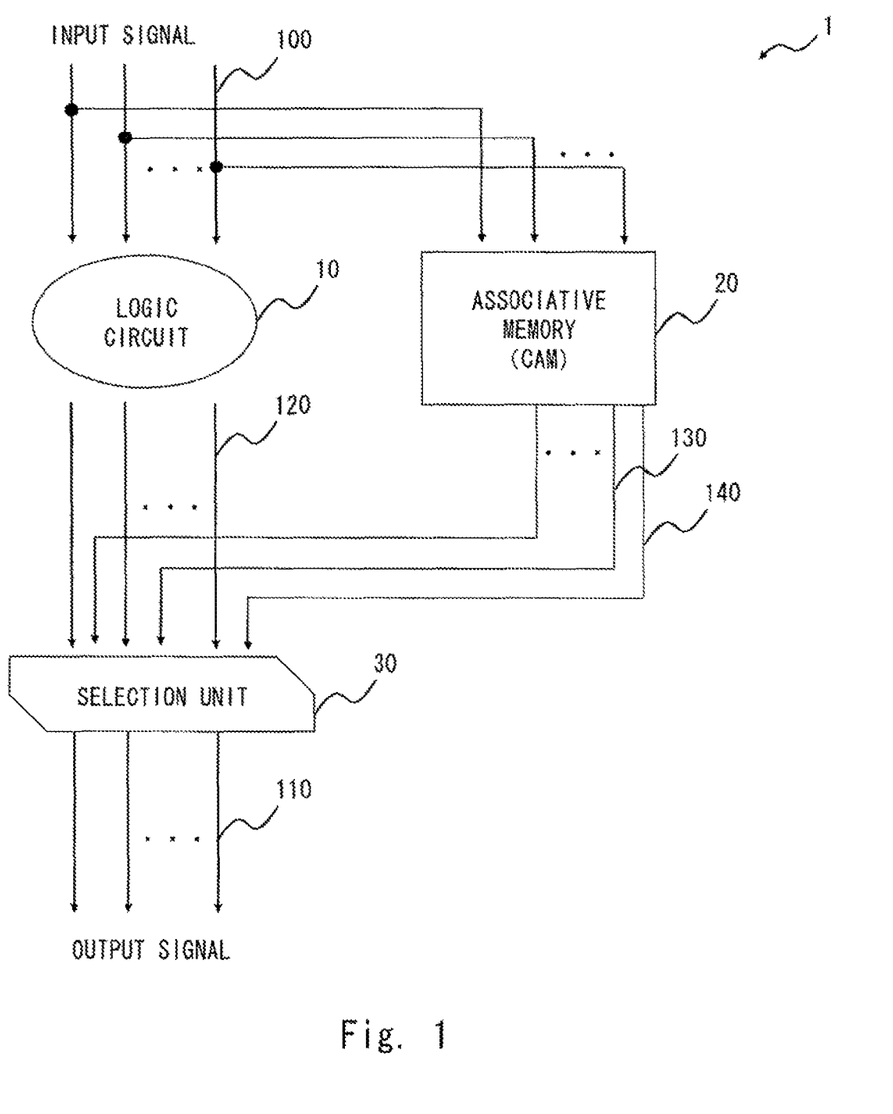
FIG. 1 is a configuration diagram of an error correction circuit in accordance with a first exemplary embodiment of the present invention.

The logic circuit 10 is supplied with an input signal(s) 100, and outputs an output signal(s) 120 to the selection unit 30.

The CAM 20 is disposed in parallel with the logic circuit 10, and is supplied with the same input signal(s) 100 as that for the logic circuit 10. The CAM 20 handles an input signal 100 as a word, and includes a table that holds an output signal related to the word and an error correction code used to correct the output signal. The "word" is data that serves as a key to search the associative memory, and the value of an input signal is input as the word. In the table, data is set such that the table is logically equivalent to the logic circuit 10. The CAM 20 includes error correction unit. When an input signal 100 is input to the CAM 20, the error correction unit extracts an output signal related to a word corresponding to the input signal 100 and an error correction code from the table, and outputs an error correction signal. The CAM 20 outputs an output signal 130 in which an error was corrected (hereinafter referred to as "error-corrected output signal 130") corresponding to the input signal 100 to the selection unit 30 based on the above-described table by using the error correction unit. Details of the configuration and operation of the CAM 20 are explained later.

The selection unit 30 selects either one of an input signal 120 from the logic circuit 10 and an input signal 130 from the CAM 20, and outputs as an output signal 110 to other circuits (not shown). Specifically, when there is a word corresponding to an input signal 100 in the CAM 20, the selection unit 30 selects a signal 130 input from the CAM 20 and outputs the signal 130 to other circuits (not shown). In any other cases, the selection unit 30 selects a signal 120 input from the logic circuit 10 and outputs the signal 120 to other circuits (not shown). In this way, the selection unit 30 can output an output signal equivalent to that of the logic circuit 10 to other circuits (not shown). Further, when an error-corrected signal 130 is to be output to other circuits (not shown), it is possible to output a signal having no error to other circuits (not shown) even when a problem such as a soft error has occurred inside the LSI device.

In this exemplary embodiment, the selection unit 30 determines whether or not there is a word corresponding to the input signal 100 in the CAM 20 based on a CAM match signal 140 output from the CAM 20. When there is data corresponding to the input signal 100 in the CAM 20, the CAM 20 outputs an error-corrected signal 130 and a CAM match signal 140 indicating that corresponding data exists in the CAM 20, i.e., an entry exists in the CAM 20 to the selection unit 30.

Although whether an entry corresponding to the input signal 100 exists in the CAM 20 or not is determined based on the type of the CAM match signal 140 in this exemplary embodiment, it is not necessarily limited to this method. For example, the CAM 20 may outputs the CAM match signal 140 to the selection unit 30 only when there is data of a CAM word 211 corresponding to the input signal 100.

Further, a control unit capable of grasping an input signal 100 and a table located in the CAM 20 may be provided. In this case, the control unit controls the selection unit 30 by, for example, notifying the selection unit 30 of the signal that the selection unit 30 should output.

Figure 2:
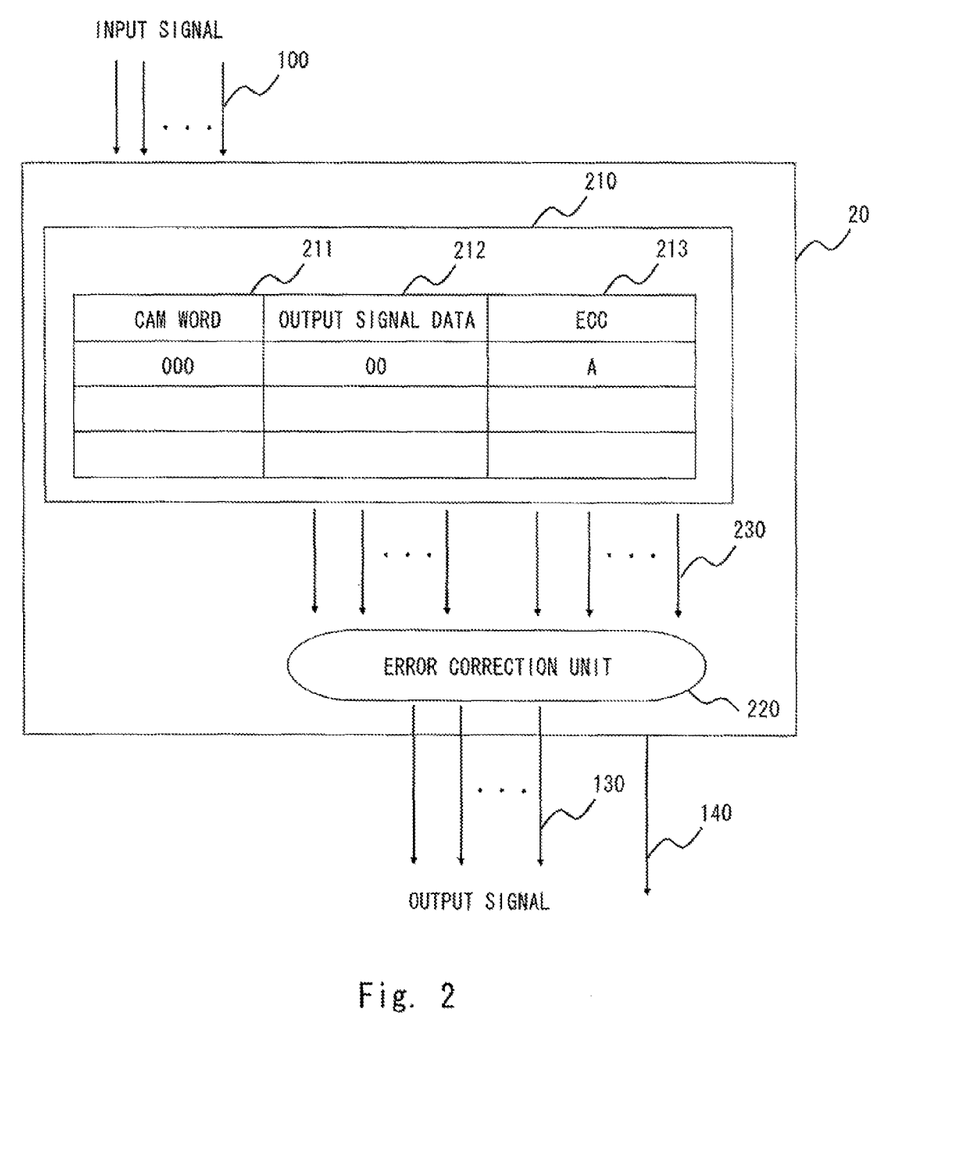
FIG. 2 is a configuration diagram of an associative memory in accordance with a first exemplary embodiment of the present invention.

Next, details of the CAM 20 are explained hereinafter. FIG. 2 shows an internal configuration of a CAM 20. The CAM 20 includes a table 210 and error correction unit 220. The table 210 is a table composed of "word 211" (hereinafter referred to as "CAM word 211"), "output signal data 212", and "ECC (error correction code) 213".

In the CAM word 211, possible data of the input signal 100 that may be input to the CAM 20 are stored. For example, FIG. 2 indicates that "000" may be input as an input signal 100 to the CAM 20. In the output signal data 212, data of output signals corresponding to the input signals that are entered in the CAM word 211 are stored. For example, the example shown in FIG. 2 indicates that "00" is output when a signal "000" is input to the CAM 20. In the ECC 213, correction codes used to correct an error of data of the output signal data 212 are stored. Data stored in the ECC 213 may have a correction code format used to correct an error of data of the output signal data 212. Examples of the format include Hamming code. In the example shown in FIG. 2, the data of the ECC 213 that is used to correct the output signal "00" is "A".

Entries of the table 210, i.e., sets of data of the CAM word 211, data of the output signal data 212, and data of the ECC 213 are externally set by a user so that the table 210 is logically equivalent to the logic circuit 10.

Figure 3:
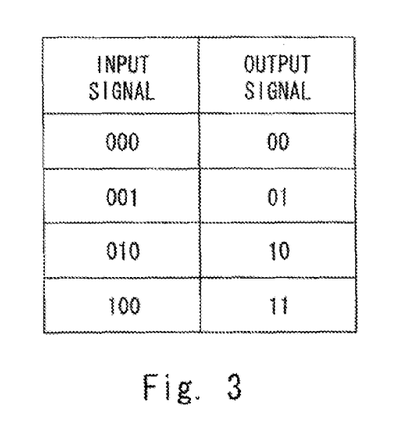
FIG. 3 is a table showing input/output signals of a logic circuit in accordance with a first exemplary embodiment of the present invention.

An example of the operation of the logic circuit 10 is shown in a truth table in FIG. 3. According to the truth table of FIG. 3, the input signal 100 to be input to the logic circuit 10 is a 3-bit signal. Further, there are four possible bit values composed of "000", "001", "010" and "100". When "000" is input in the logic circuit 10, it outputs an output signal "00". Similarly, when "001" is input, it outputs an output signal "01". When "010" is input, it outputs an output signal "10". When "100" is input, it outputs an output signal "11". A user sets entries corresponding to part or all of the input/output signals in the table 210 so that the table 210 is equivalent to the inputs/outputs shown in the truth table of FIG. 3.

Next, the internal processing of the CAM 20 performed when an input signal 100 is input to the CAM 20 is explained hereinafter. When an input signal 100 is input, the CAM 20 performs a search to determine whether or not data of the CAM word 211 corresponding to the input signal 100 is held. If the data is held, the CAM 20 uses data of the output signal data 212 corresponding to the data of the CAM word 211 and data of the ECC 213 as an input (230) to the error correction unit 220. Further, the CAM 20 also outputs a CAM match signal 140 indicating that an entry exists in the CAM 20 to the selection unit 30. In the example shown in FIG. 2, when "000" is input as an input signal 100, an output signal data "00" and an ECC "A" are supplied as an input signal 230 to the error correction unit 220. On the other hand, if data of the CAM word corresponding to the input signal 100 is not held in the table 210, the CAM 20 supplies a CAM match signal 140 indicating that an entry does not exist in the CAM 20 to the selection unit 30.

The error correction unit 220 corrects an error of data of a supplied output signal based on the data of the output signal and the data of the ECC data. The error correction unit 220 outputs a signal in which an error was corrected (hereinafter referred to as "error-corrected signal") as an output signal 130 to the selection unit 30. The error correction using an ECC performed by the error correction unit 220 can be implemented by various publicly-known techniques. Disclosed examples of the error correction technique in associative memories include techniques disclosed in Japanese Unexamined Patent Application Publications Nos. 02-153457 and 2004-362315.

Note that it may be also configured such that an error-corrected signal 130 obtained by the error correction unit 220 is written back in the table 210. In this way, in the case where contents of the table 210 are rewritten from the initial setting state due to a soft error or the like, the correct values can be reset in the table 210. Further, the data that are to be corrected by the error correction unit 220 may include data held in the CAM word 211. Further, the CAM 20 may be configured with a patrol function with which each entry of the CAM 20 is read periodically to perform correction processing on each entry.

With the above-described series of processes, the following advantages can be obtained. When data of the CAM word 211 corresponding to an input signal 100 exists in the table 210 in the CAM 20, the CAM 20 extracts data of an output signal corresponding to the data of the CAM word and data of an ECC. The error correction unit 220 outputs an error-corrected signal 130 to the selection unit 30 based on these data. The table in the CAM 20 is configured so that it outputs equivalent values as those of the logic circuit 10. Therefore, with the selection unit 30 that uses this error-corrected signal 130 as an output signal, it is possible to provide an LSI device that has therein a logic circuit equipped with an error correction function.

Further, when data of the CAM word corresponding to an input signal 100 does not exist in the table in the CAM 20, the selection unit 30 selects an output signal from the logic circuit 10, which is disposed in parallel with the CAM 20, and outputs the selected output signal to other circuits (not shown). In this way, even when the table 210 in the CAM 20 does not hold data that is completely equivalent to that of the logic circuit 10, it can still operate properly as a logic circuit.

Further, entries in the table 210 in the CAM 20 can be set from the outside. Therefore, when the error correction circuit is applied to an LSI device, there is another advantage that a logic bug(s) can be fixed without changing the configuration of the LSI device by making the setting of the table 210.

[Second Exemplary Embodiment]

In a second exemplary embodiment in accordance with the present invention, data of the table 210 in the CAM 20 is updated as appropriate. A fundamental configuration of an error correction circuit in accordance with this exemplary embodiment of the present invention is explained with reference to FIG. 4. In the error correction circuit in accordance with this exemplary embodiment, the logic circuit 10 also outputs an output signal to the CAM 20 in contrast to the error correction circuit in accordance with the first exemplary embodiment. Note that the configuration of logic circuit 10 (FIG. 3) and the internal configuration of the CAM 20 are similar to those of the first exemplary embodiment. Part of the operation of the error correction circuit shown in FIG. 4 that is different from that of the first exemplary embodiment is explained hereinafter.

Figure 4:
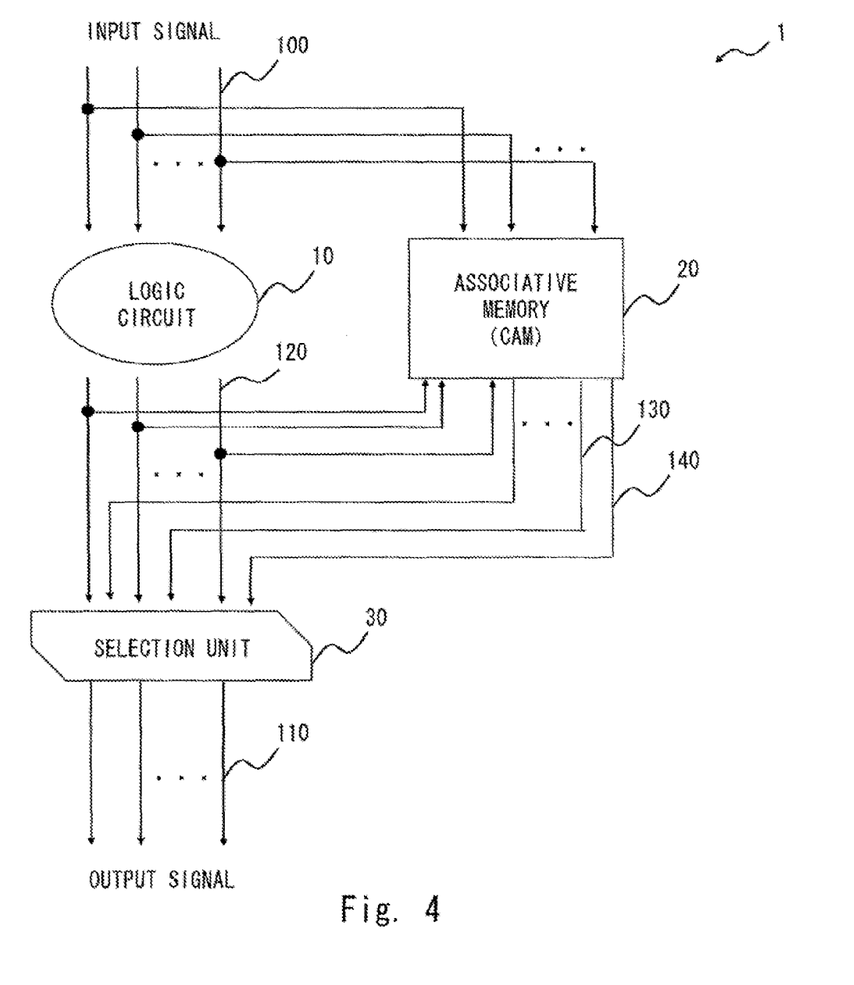
FIG. 4 is a configuration diagram of an error correction circuit in accordance with a second exemplary embodiment of the present invention.

An operation performed when an input signal 100 is input to the logic circuit 10 and the CAM 20 is explained with reference to an error correction circuit diagram shown in FIG. 4 and the CAM 20 shown in FIG. 2. When "010" is input as an input signal 100, the logic circuit 10 outputs an outputs signal "10" to the selection unit 30 and the CAM 20. Meanwhile, when "010" is input to the CAM 20 as an input signal 100, the table 210 in the CAM 20 does not have "010" as a CAM word 211. Therefore, the CAM 20 outputs a CAM match signal 140 indicating that an entry does not exist in the CAM 20 to the selection unit 30. The operation of the selection unit 30 is similar to that of the first exemplary embodiment, and therefore its explanation is omitted.

Figure 5:
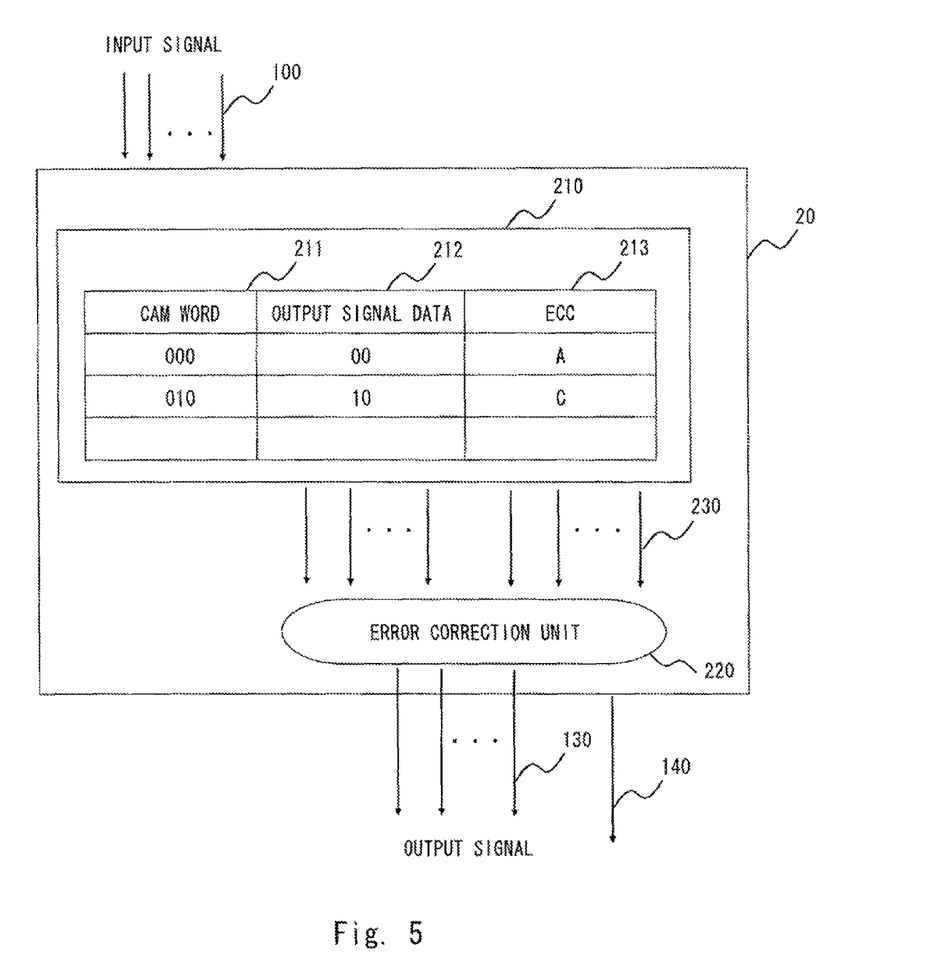
FIG. 5 is a configuration diagram of an associative memory in accordance with a second exemplary embodiment of the present invention.

In this exemplary embodiment, when an input signal 100 that is not stored as data of the CAM word 211 is input to the CAM 20, the CAM 20 performs additional processing explained below. The CAM 20 calculates an error correction code from the signal input from the logic circuit 10. The error correction code is calculated by a known error correction technique such as Hamming code. The CAM 20 uses the data of the input signal 100 as data of the CAM word 211 and the input signal from the logic circuit 10 as data of the output signal data 212, and stores the calculated error correction code as data of the ECC 213. For example, when "010" is input as the input signal 100, the CAM 20 updates the table 210 by storing "010", "10", and "C", which is calculated by a known error correction technique, as data of the CAM word 211, data of the output signal data 212, and the data of the ECC 213 respectively. FIG. 5 shows a configuration of the CAM 20 in a case where the above-described data registration is performed for the table 210 shown in FIG. 2.

Next, an operation of the error correction circuit performed when another input signal 100 is also input to the logic circuit 10 and the CAM 20 in the state of the CAM 20 shown in FIG. 5 is explained. When "010" is input as the input signal 100, data of the CAM word 211 corresponding to "010" exists in the table 210 in the CAM 20. Therefore, the CAM 20 performs an error correction for "10", which is data of the output signal data 212, by using "C", which is data of the ECC 213, and outputs an error-corrected signal 130 to the selection unit 30.

Note that a FIFO (First In First Out) scheme may be used for the data setting to the table 210 in the CAM 20, and a configuration in which the number of entries of the table 210 is smaller than the number of possible combinations of the input signal 100 may be used. In such a case, the number of entries of the table 210 can be reduced.

With the above-described series of processes, it is possible to automatically update the entries of the table 210 in the CAM 20. An entry that is automatically input is stored based on an output signal from the logic circuit 10. Therefore, the CAM 20 can perform processing equivalent to that of the logic circuit 10. Further, since the entries of the table 210 are automatically updated, a user does not need to set the data of the table 210 in advance. That is, there is an advantage that a user does not need to grasp the configuration of the logic circuit.

Note that the present invention is not limited to above-described exemplary embodiments, and various modifications can be made without departing from the spirit and scope of the present invention.

The present invention can provide, in an exemplary aspect, an error correction circuit capable of correcting an error with a simple configuration.

The first and second exemplary embodiments can be combined as desirable by one of ordinary skill in the art.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. An error correction circuit comprising:
   a logic circuit to receive an input signal and to responsively output a first output signal;
   an associative memory to receive the input signal, and comprising:
   a table storing a content-addressable memory (CAM) word, a second output signal related to the CAM word, and an error correction code (ECC) used to correct the second output signal;
   an error correction unit to extract the second output signal related to the word and the ECC, and to output an error correction signal in which an error corresponding to the input signal has been corrected;
   a selection unit coupled to both the logic circuit and the associative memory to:

where the CAM word corresponds to the input signal, select the error correction signal; and where the input signal does not correspond to the input signal, select the first output signal.

2. The error correction unit according to claim 1, when the CAM word corresponds to the input signal, the associative memory outputs a CAM match signal, and when the associative memory outputs the CAM match signal, the selection unit selects and outputs the error correction signal.

3. The error correction unit according to claim 2, when the CAM word does not correspond to the input signal, the associative memory does not output the CAM match signal, and when the associative memory does not output the CAM match signal, the selection unit selects and outputs the first output signal.

4. The error correction unit according to claim 1, wherein when the error has been corrected by the error correction unit, the error correction signal is registered in the table.

5. The error correction unit according to claim 1, wherein the table comprises one or more entries by which data replacement is achieved on a first-in, first-out (FIFO) basis.

6. An large scale integration (LSI) device including the error correction circuit according to claim 1.

7. An error correction method to correct a first output signal output by a logic circuit responsive to an input signal, comprising:

inputting the input signal to an associative memory having a table storing a content-addressable memory (CAM) word, a second output signal related to the CAM word, and an error correction code (ECC) used to correct the second output signal;

when the CAM word corresponds to the input signal, outputting an error correction signal in which an error corresponding to the input signal has been corrected based on the second output signal and the ECC;

when the CAM word does not correspond to the input signal, outputting the first output signal.

\* \* \* \* \*